(12) United States Patent
Kuo et al.

(10) Patent No.: US 11,651,974 B2
(45) Date of Patent: May 16, 2023

(54) SEMICONDUCTOR PACKAGE AND METHOD OF FABRICATING THE SAME

(71) Applicant: CHIPBOND TECHNOLOGY CORPORATION, Hsinchu (TW)

(72) Inventors: Chih-Ming Kuo, Hsinchu County (TW); Lung-Hua Ho, Hsinchu (TW); You-Ming Hsu, Kaohsiung (TW); Fei-Jain Wu, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 44 days.

(21) Appl. No.: 17/161,818

(22) Filed: Jan. 29, 2021

(65) Prior Publication Data

US 2022/0037166 A1    Feb. 3, 2022

(30) Foreign Application Priority Data

Jul. 29, 2020   (TW) .................. 109125687

(51) Int. Cl.
| | |
|---|---|
| *H01L 21/56* | (2006.01) |
| *H01L 23/31* | (2006.01) |
| *H01L 23/00* | (2006.01) |
| *H01L 21/78* | (2006.01) |

(52) U.S. Cl.
CPC .......... *H01L 21/561* (2013.01); *H01L 21/565* (2013.01); *H01L 21/568* (2013.01);
(Continued)

(58) Field of Classification Search
CPC ... H01L 21/561; H01L 21/565; H01L 21/568; H01L 21/78; H01L 23/3107; H01L 23/562; H01L 23/3128; H01L 2221/68331; H01L 2221/68345; H01L 2224/04105; H01L 2224/12105; H01L 2224/16227; H01L 2224/214; H01L 2224/81005;
(Continued)

(56) References Cited

U.S. PATENT DOCUMENTS 9,576,931 B1    2/2017   Shih
2013/0295720 A1  11/2013  Fuergut et al.
(Continued)

FOREIGN PATENT DOCUMENTS

CN   106409699 A    2/2017
JP   2017-5009 A    1/2017
(Continued)

OTHER PUBLICATIONS

Taiwanese Office Action dated Mar. 12, 2021 for Taiwanese Patent Application No. 109125687, 5 pages.
(Continued)

*Primary Examiner* — Thanh T Nguyen
(74) *Attorney, Agent, or Firm* — Demian K. Jackson; Jackson IPG PLLC

(57) ABSTRACT

A method of fabricating a semiconductor package includes the steps of: disposing semiconductor devices on a carrier; forming an encapsulation on the carrier to cover the semiconductor devices, a recession of the encapsulation includes a strengthening portion and a recessed portion, the strengthening portion protrudes from the recessed portion and surrounds the recessed portion; and removing the strengthening portion of the recession of the encapsulation.

7 Claims, 10 Drawing Sheets

(52) U.S. Cl.
CPC .......... *H01L 21/78* (2013.01); *H01L 23/3107* (2013.01); *H01L 23/562* (2013.01)

(58) Field of Classification Search
CPC ......... H01L 2224/96; H01L 2924/1815; H01L 2924/18161; H01L 2924/18162; H01L 2924/3511; H01L 21/56; H01L 21/6835; H01L 21/6836; H01L 2221/68327; H01L 23/315; H01L 23/49816; H01L 2221/6834
See application file for complete search history.

(56) References Cited

U.S. PATENT DOCUMENTS

| | | | |
|---|---|---|---|
| 2014/0061944 A1* | 3/2014 | Lin ....................... | H01L 23/315 257/774 |
| 2015/0021754 A1 | 1/2015 | Lin et al. | |
| 2015/0060872 A1* | 3/2015 | Hosseini ............. | H01L 23/4951 257/77 |
| 2016/0276238 A1 | 9/2016 | Lin et al. | |

FOREIGN PATENT DOCUMENTS

| | | | |
|---|---|---|---|
| TW | 202011539 A | 3/2020 | |
| TW | 202011554 A | 3/2020 | |

OTHER PUBLICATIONS

Japanese Office Action dated Mar. 29, 2022 for Japanese Patent Application No. 2021-069248, 4 pages.

* cited by examiner

SEMICONDUCTOR PACKAGE AND METHOD OF FABRICATING THE SAME

FIELD OF THE INVENTION

This invention relates to a method of fabricating a semiconductor package, and more particularly to a method of fabricating a semiconductor package having a recessed encapsulation.

BACKGROUND OF THE INVENTION

In conventional semiconductor package fabrication, semiconductor devices are embedded in epoxy molding compound (EMC), and the EMC is cured to form an encapsulation which is provided to protect the semiconductor devices from external impact, moisture or static electricity. Electronic devices are getting thinner and lighter so thickness reduction of the encapsulation is necessary. However, a semiconductor package with a too thin encapsulation may have problems of insufficient strength and warpage during delivery or in the subsequent processes. For example, redistribution layers (RDLs) are provided to extend chip's outputs outward to increase output density in fan-out wafer level packaging, but bonding of RDLs with chip's pads is not easy if semiconductor package is reduced in thickness with insufficient strength, or a conventional wafer support system is required for subsequent processing following increased costs.

SUMMARY

One object of the present invention is to form a recession on an encapsulation to reduce semiconductor package thickness, and a strengthening portion rimmed the recession enables the thinned semiconductor package to remain enough strength and flatness and mitigate the risk of warpage during subsequent processing procedures.

A method of fabricating semiconductor package of the present invention includes the steps of: disposing a plurality of semiconductor devices on a carrier; forming an encapsulation on the carrier, the encapsulation is configured to cover the semiconductor devices and includes a recession which includes a strengthening portion and a recessed portion, the strengthening portion protrudes from the recessed portion and surrounds the recessed portion; and removing the strengthening portion of the recession of the encapsulation.

A semiconductor package of the present invention includes a carrier, a plurality of semiconductor devices and an encapsulation. The semiconductor devices are disposed on the carrier. The encapsulation is formed on the carrier to cover the semiconductor package. There is a recession on the encapsulation, and the recession includes a strengthening portion and a recessed portion. The strengthening protrudes from the recessed portion and surrounds the recessed portion.

The strengthening portion of the recession formed on the encapsulation can make the semiconductor package have sufficient strength and flatness to prevent the occurrence of warpage. In addition, because of the existence of the strengthening portion, the recessed portion of the encapsulation can be thinner and a conventional wafer support system is not required during subsequent processing. Thus, the complexity of semiconductor package fabrication can be reduced substantially.

DETAILED DESCRIPTION OF THE INVENTION

Figure 1A:
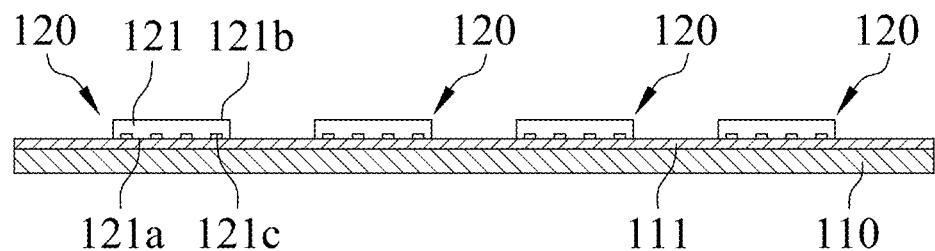
FIGS. 1A to 1F are diagrams illustrating a method of fabricating a semiconductor package in accordance with a first embodiment of the present invention.

Processes of fabricating a semiconductor package in accordance with a first embodiment of the present invention are presented in FIGS. 1A to 1E With reference to FIG. 1A, semiconductor devices 120 are picked and placed on a carrier 110, the semiconductor devices 120 in the first embodiment are chips 121 each having an active surface 121a and a back surface 121b, and there are pads 121c disposed on the active surface 121a. An adhesive layer 111 is applied on the carrier 110 and provided to adhere the chips 121 to the carrier 110 as the active surface 121a of each of the chips 121 contact with the carrier 110. The adhesive layer 111 is, but not limit to, made of a temporary bonding material (TBM).

Figure 1B:
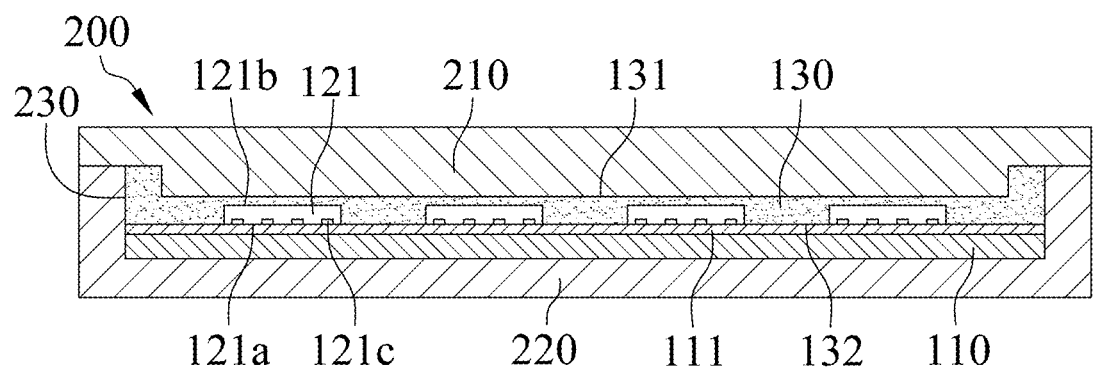

With reference to FIG. 1B, an encapsulation 130 is formed on the carrier 110 to cover the semiconductor devices 120. The encapsulation 130 of the first embodiment is formed by the steps of a) providing a mold 200 which includes a upper mold 210 and a lower mold 220, b) placing the carrier 110 and an encapsulating material on the lower mold 220 or placing the carrier 110 and the encapsulating material on the upper mold 210 and the lower mold 220 respectively, c) closing the mold 200 to form a mold cavity 230, the walls of the mold cavity 230 compress and shape the encapsulating material to allow the encapsulating material to cover the semiconductor devices 120, and d) high-temperature curing the encapsulating material to form the encapsulation 130. Please note that the upper mold 210 and the lower mold 220 are the molds located at upper and lower positions in the drawing respectively, not upper movable mold half and lower fixed mold half used in practical production. In the first embodiment, the mold cavity 230 is a U-shaped cavity formed by the profile of the upper mold 210 or the lower mold 220, thus the encapsulating material is shaped and cured to become the encapsulation 130 having a recession 131 directly. In other embodiment, a release film or a spacer located on the release film are provided to change the shape of the mold cavity 230. Before placing the carrier 110 on the lower mold 220, the release film is laid on the upper mold 210 and the lower mold 220 to help release the encapsulation 130 from the mold 200. Preferably, a release film having a central projection or a flat release film having a spacer at middle enable the mold cavity 230 to have a concave shape such that the encapsulation material is shaped and cured to become the encapsulation 130 having the recession 131. If the spacer is not reactive with the encapsulating material, the release film is optional and the spacer can be placed on center of the upper mold 210 or the lower mold 220 to make the mold cavity 230 have a concave shape.

Figure 1C:
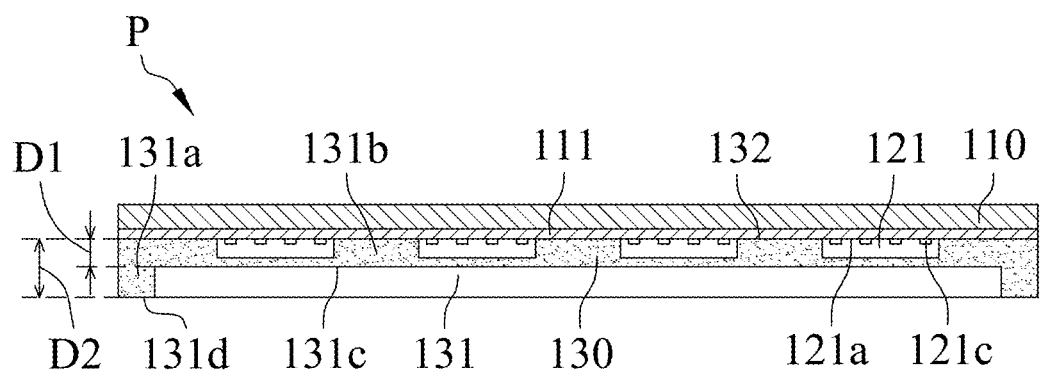

With reference to FIG. 1C, a semiconductor package P having the recession 131 is separated from the upper mold 210 and the lower mold 220. The recession 131 includes a strengthening portion 131a and a recessed portion 131b, the strengthening portion 131a protrudes from and fringes the recessed portion 131b, and the recessed portion 131b has a recession bottom 131c. A first distance D1 from the recession bottom 131c of the recessed portion 131b to a bottom surface 132 of the encapsulation 130 is preferably less than or equal to 500 μm for thickness reduction of the semiconductor package P. In this embodiment, the first distance D1 is, but not limit to, 400 μm or 500 μm. A second distance D2 from a top surface 131d of the strengthening portion 131a to the bottom surface 132 of the encapsulation 130 is more than or equal to 600 μm, consequently, the strengthening portion 131a has a higher strength than the recessed portion 131b. The strengthening portion 131a surrounding the recessed portion 131b can offer sufficient strength and flatness so additional support system is not required during subsequent processing procedures of the semiconductor package P. The second distance D2 is, but not limit to, 600 μm or 700 μm in the first embodiment.

Figure 6A:
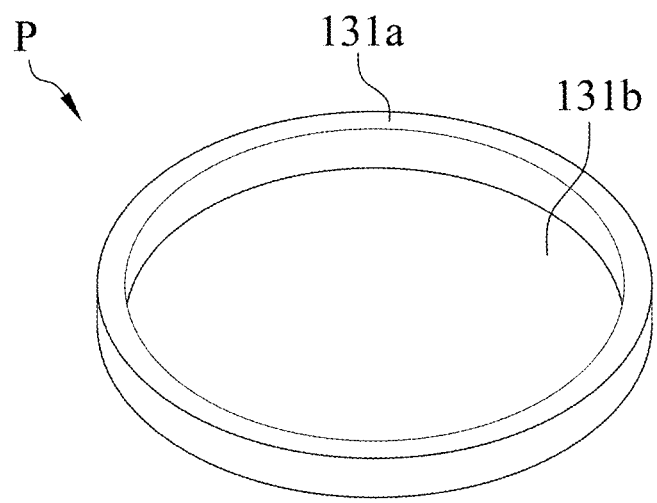
FIGS. 6A and 6B are perspective diagrams illustrating semiconductor packages in accordance with different embodiments of the present invention respectively.
Figure 6B:
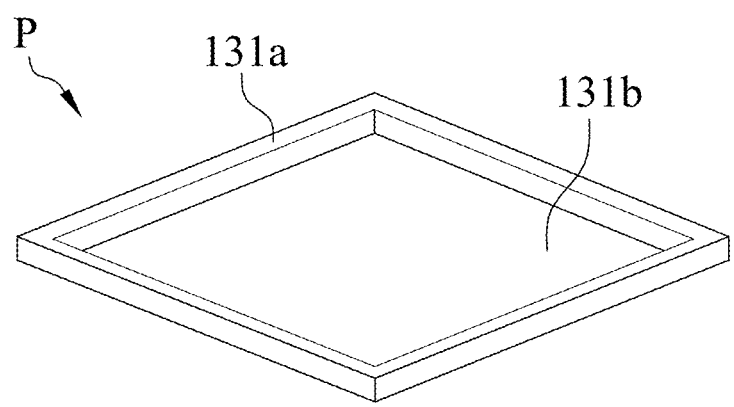

With reference to FIGS. 6A and 6B, the semiconductor package P may be a wafer level package having a circular shape or a panel level package having a rectangular shape. Both of the wafer level package and the panel level package have a reduced thickness due to the formation of the recessed portion 131b of the recession 131, and both have a sufficient strength with the help of the strengthening portion 131a of the recession 131.

Figure 7:
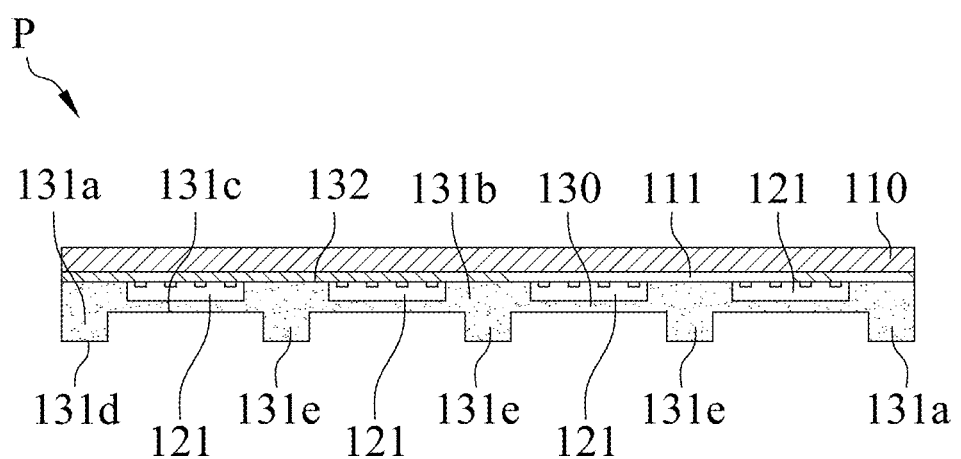
FIG. 7 is a cross-section view diagram illustrating a semiconductor package in accordance with one embodiment of the present invention.

As shown in FIG. 7, there are stiffening ribs 131e arranged on the recession bottom 131c of the recession 131 to further enhance the strength of the semiconductor package P, and they may have any shape or be arranged along dicing streets. In other embodiment, the stiffening ribs 131e are formed on the recession bottom 131c of the recession 131 during secondary packaging.

Figure 1D:
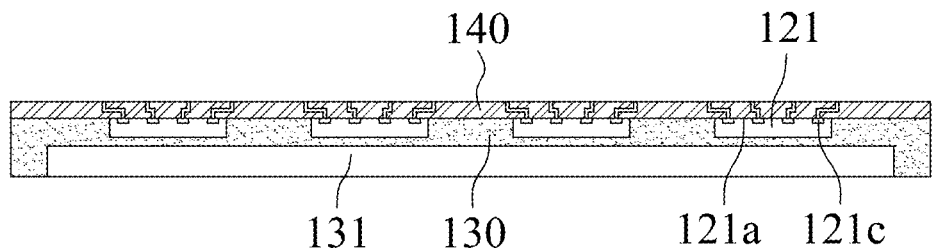

With reference to FIG. 1D, the carrier 110 is removed to expose the pads 121c of the chips 121 and a redistribution layer (RDL) 140 is disposed on the active surface 121a of each of the chips 121 to be electrically connected to the pads 121c. The RDL 140 on the active surface 121a of each of the chips 121 is a multi-layer which includes passive layers and metal layers formed by patterned photoresist and metal plating process. The RDL 140 is provided to extend the pads 121c to other positions for connecting with connectors 150.

Figure 1E:
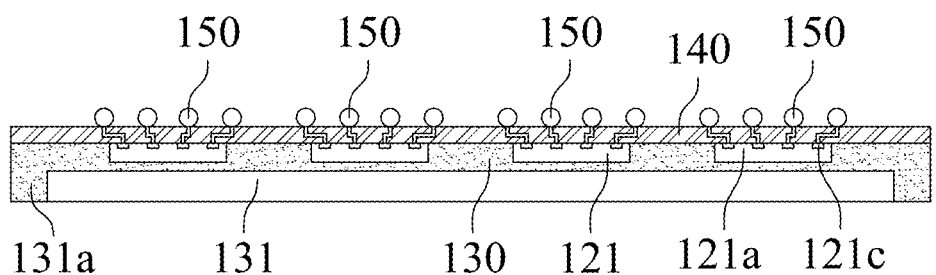

With reference to FIG. 1E, the connectors 150 are disposed on the RDL 140 to be electrically connected to the pads 121c via the RDL 140. The connectors 150 are solder balls in the first embodiment, and they may be bumps in other embodiment.

Figure 1F:
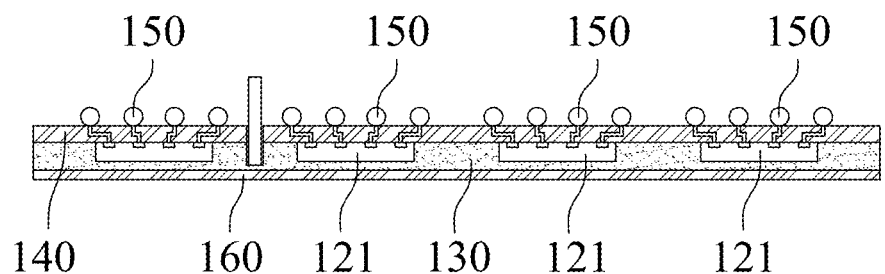

With reference to FIG. 1F, the encapsulation 130 is adhered to a dicing tape 160 and diced into multiple semiconductor package elements. The strengthening portion 131a of the encapsulation 130 can be removed together while the encapsulation 130 is cut by laser or wafer saw blade. The stiffening ribs 131e, formed on the recession bottom 131c of the recession 131 and arranged along the dicing streets, also can be removed when dicing the encapsulation 130. On the other hand, the stiffening ribs 131e having any shape and not arranged along the dicing streets need to be grinded and removed before dicing the encapsulation 130 because they may make the flatness of the encapsulation 130 too low to be cut.

Figure 2A:
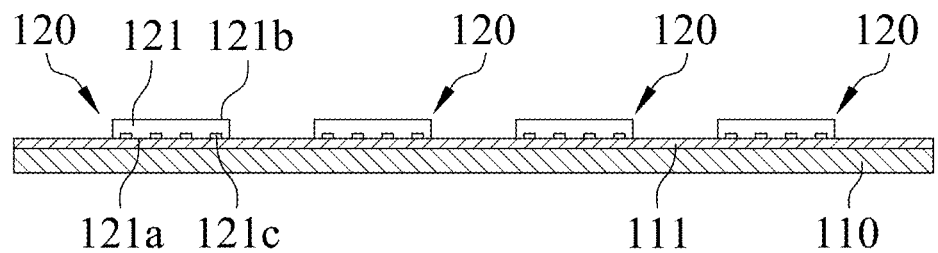
FIGS. 2A to 2C are diagrams illustrating a method of fabricating a semiconductor package in accordance with a second embodiment of the present invention.
Figure 2B:
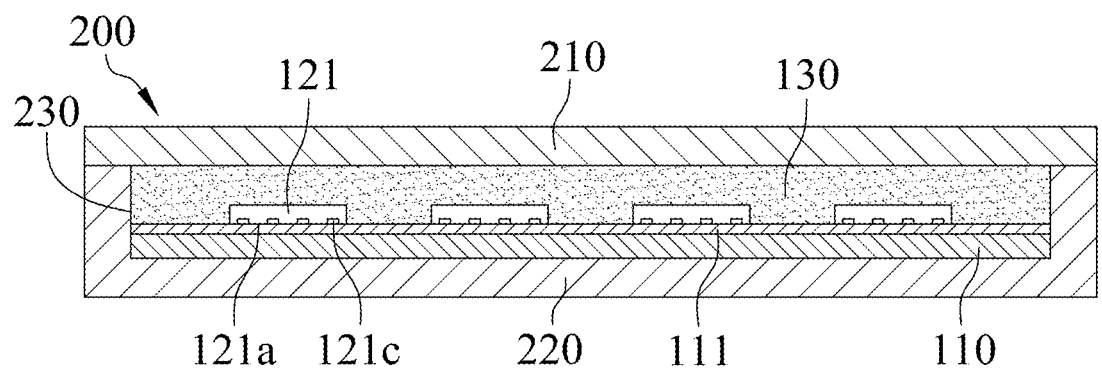
Figure 2C:
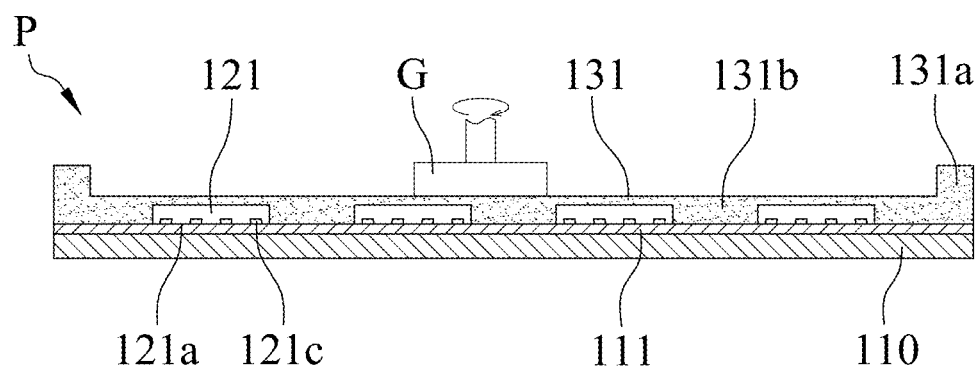

FIGS. 2A to 2C present a method of fabricating a semiconductor package in accordance with a second embodiment of the present invention. Different to the first embodiment, the encapsulation 130 is grinded to form the recession 131 in the second embodiment. With reference to FIG. 2A, the semiconductor devices 120 are picked and placed on the adhesive layer 111 of the carrier 110. Subsequently, with reference to FIG. 2B, the carrier 110 is placed in the mold cavity 230 of the mold 200 and the encapsulation 130 is formed on the carrier 110 to cover the semiconductor devices 120. As shown in FIG. 2C, a grinder G is provided to grind the surface of the encapsulation 130 except the rim such that the encapsulation 130 is shaped to generate the recession 131 having the strengthening portion 131a and the recessed portion 131b. The strengthening portion 131a surrounding the recessed portion 131b is provided to support and protect the recessed portion 131b from warpage and increase the strength and flatness of the recessed portion 131b. The subsequent processes are not repeated here because they are the same as those of the first embodiment.

In a third embodiment of the present invention as shown in FIGS. 3A to 3F, the semiconductor devices 120, different from that in the first embodiment, contact with the carrier 110 by the back surface 121b of each of the chips 121, and there are bumps 121d which are disposed on the active surface 121a of each of the chips 121 and electrically connected to the pads 121c. Additionally, the recession 131 of the encapsulation 130 is formed by grinding process in the third embodiment.

Figure 3A:
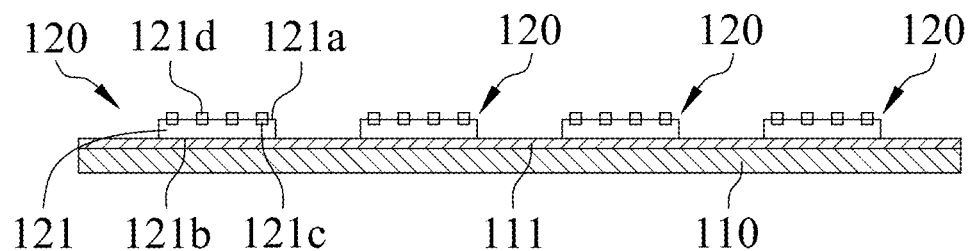
FIGS. 3A to 3F are diagrams illustrating a method of fabricating a semiconductor package in accordance with a third embodiment of the present invention.
Figure 3B:
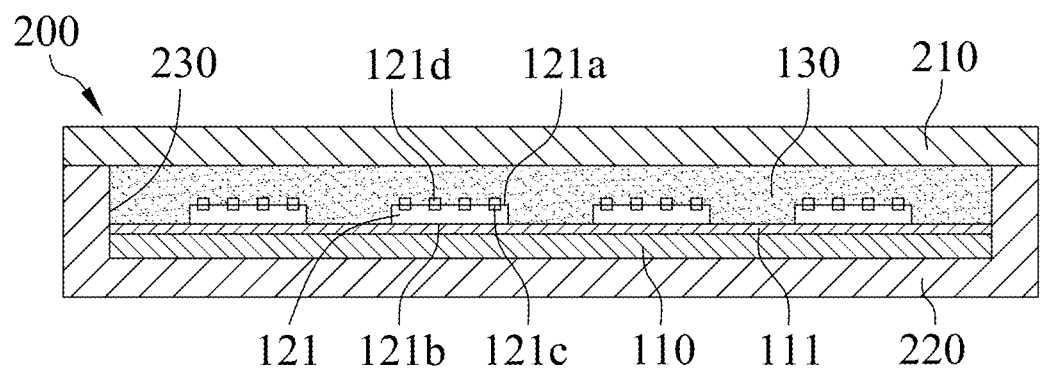
Figure 3C:
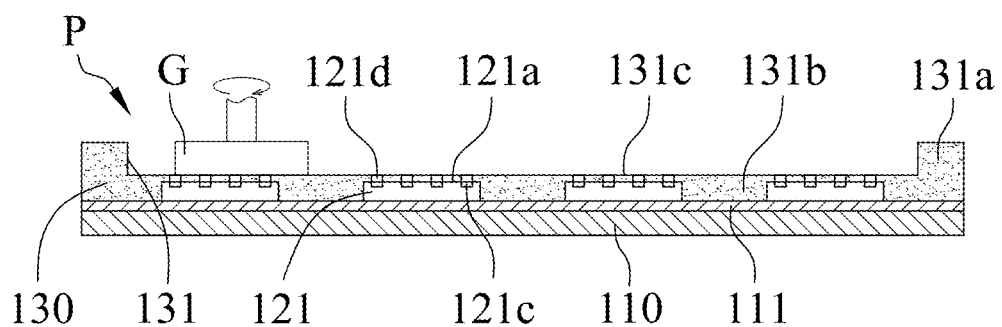

With reference to FIG. 3A, the semiconductor devices 120 are picked and placed on the carrier 110 to attach the back surface 121b of each of the chips 121 to the adhesive layer 111 of the carrier 110. With reference to FIG. 3B, the carrier 110 with the semiconductor devices 120 is placed in the mold cavity 230 of the mold 200, the encapsulating material is injected into the mold cavity 230 and heated to be cured to thereby form the encapsulation 130. With reference to FIG. 3C, the surface, but not the rim, of the encapsulation 130 is grinded by the grinder G to form the recession 131 having the strengthening portion 131a and the recessed portion 131b. The recessed portion 131b is fringed with and supported by the strengthening portion 131a so as to avoid warpage issue and enhance strength and flatness. In the third embodiment, the grinder G is provided to grind the encapsulation 130 until the bumps 121d of the chips 121 are exposed on the recession bottom 131c of the recession 131.

Figure 3D:
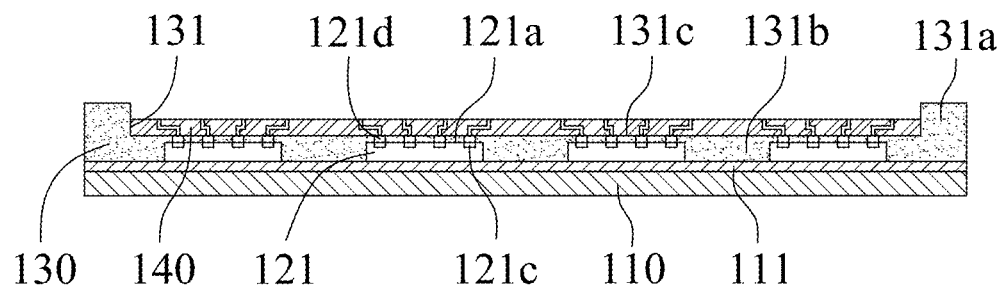
Figure 3E:
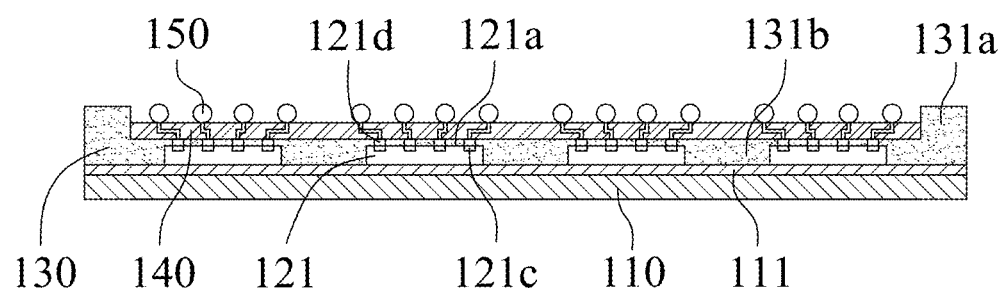
Figure 3F:
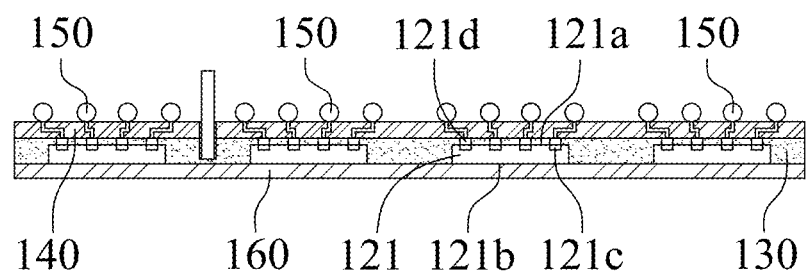

With reference to FIG. 3D, the RDL 140 is disposed on the recession bottom 131c of the recession 131 and electrically connected to the bumps 121d. The RDL 140 on the recession bottom 131c is a multi-layer comprising passive layers and metal layers fabricated by patterned photoresist and metal plating process. With reference to FIG. 3E, the connectors 150 are arranged on the RDL 140 and electrically connected to the bumps 121d via the RDL 140. The connectors 150 are solder balls in the third embodiment, but they may be bumps in other embodiment. Finally, with reference to FIG. 3F, the carrier 110 is removed, the encapsulation 130 is adhered to the dicing tape 160 and diced into the semiconductor package elements.

Figure 4A:
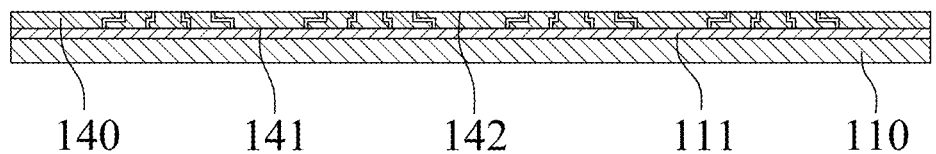
FIGS. 4A to 4E are diagrams illustrating a method of fabricating a semiconductor package in accordance with a fourth embodiment of the present invention.
Figure 4B:
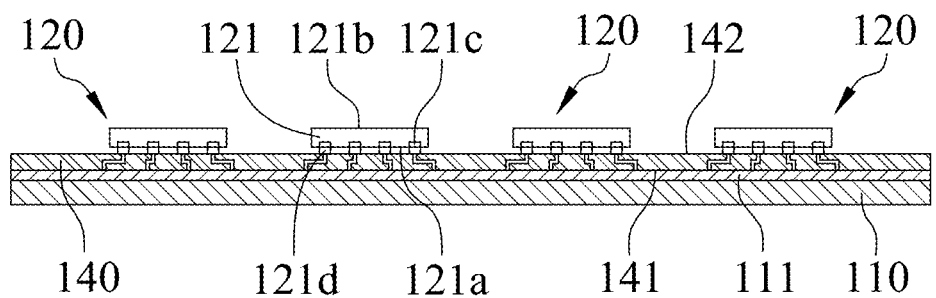

FIGS. 4A to 4E show a fourth embodiment of the present invention that differs from the first embodiment by the chips 121 of the semiconductor devices 120 and the RDL 140. With reference to FIG. 4A, the RDL 140, which may be made of multiple insulation layers and metal layers by metal-plating using patterned photoresist as mask, is disposed on the carrier 10 and contacts with the carrier 110 by its first surface 141. With reference to FIG. 4B, the chips 121 having the active surface 121a and the back surface 121b are mounted on a second surface 142 of the RDL 140, the pads 121c and the bumps 121d are located on the active surface 121a, the bumps 121d are electrically connected to the pads 121c and the RDL 140 such that the pads 121c are electrically connected to the RDL 140 via the bumps 121d.

Figure 4C:
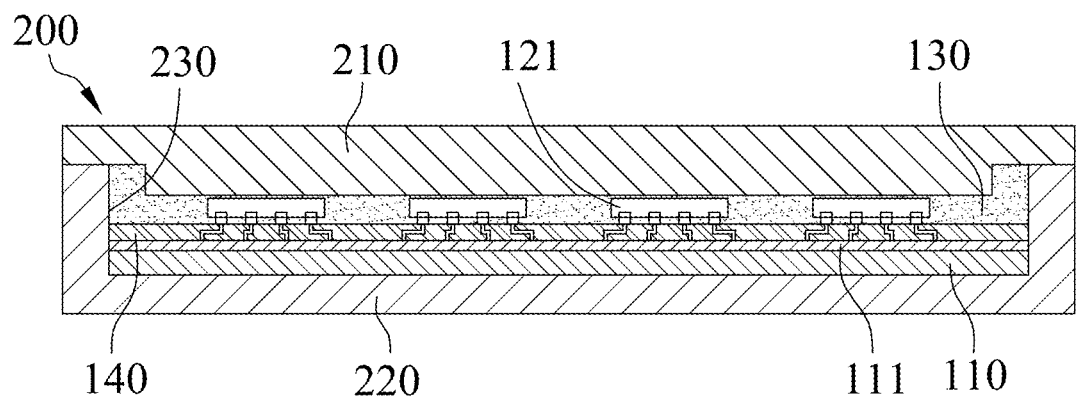
Figure 4D:
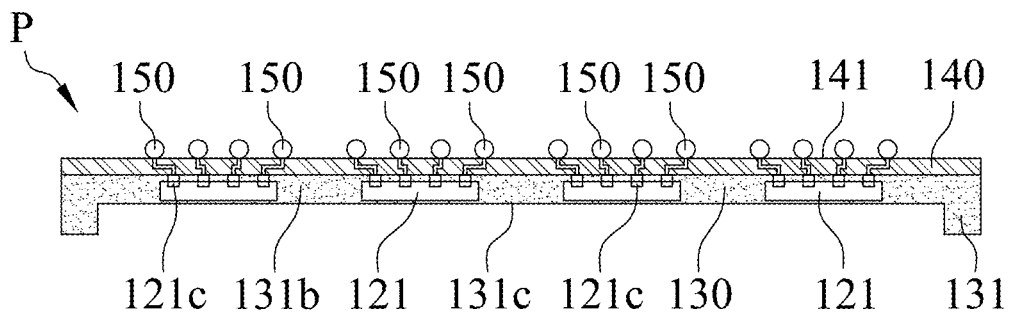
Figure 4E:
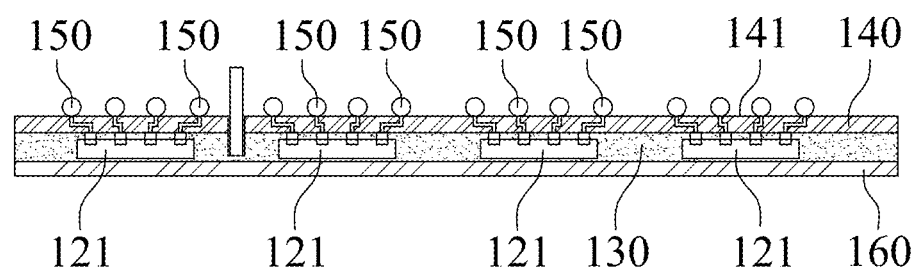

With reference to FIG. 4C, the carrier 110 and the semiconductor devices 120 thereon are placed in the mold cavity 230 of the mold 200, and the encapsulating material is injected into the mold cavity 230 and heated to become the encapsulation 130. In the fourth embodiment, the mold cavity 230 has a concave shape generated by the profile of the upper mold 210 or the lower mold 220 so that the encapsulation material injected into the mold cavity 230 is cured to become the encapsulation 130 having the recession 131 directly. With reference to FIG. 4D, the connectors 150 are disposed on the first surface 141 of the RDL 140 after removing the carrier 110 and are electrically connected to the bumps 121d via the RDL 140. The connectors 150 may be solder balls (this embodiment) or bumps (other embodiment). With reference to FIG. 4E, the encapsulation 130 is attached on the dicing tape 160 to be cut into the semiconductor package elements.

Figure 5A:
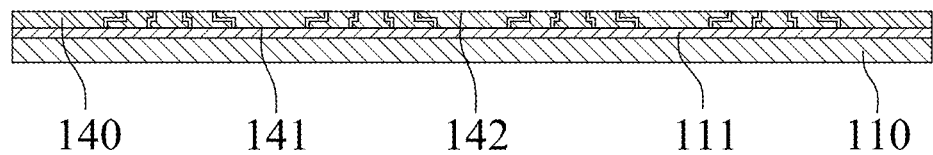
FIGS. 5A to 5D are diagrams illustrating a method of fabricating a semiconductor package in accordance with a fifth embodiment of the present invention.
Figure 5B:
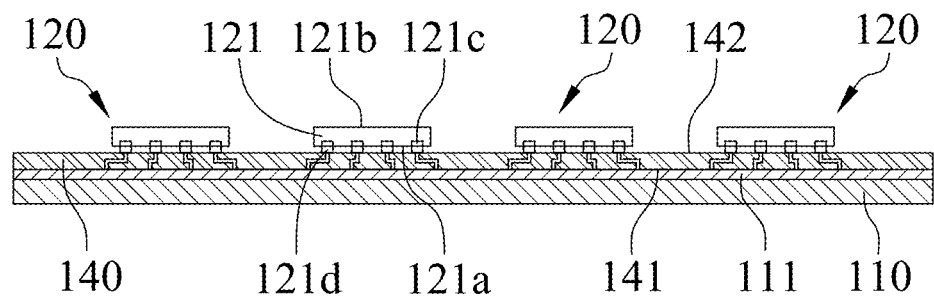
Figure 5C:
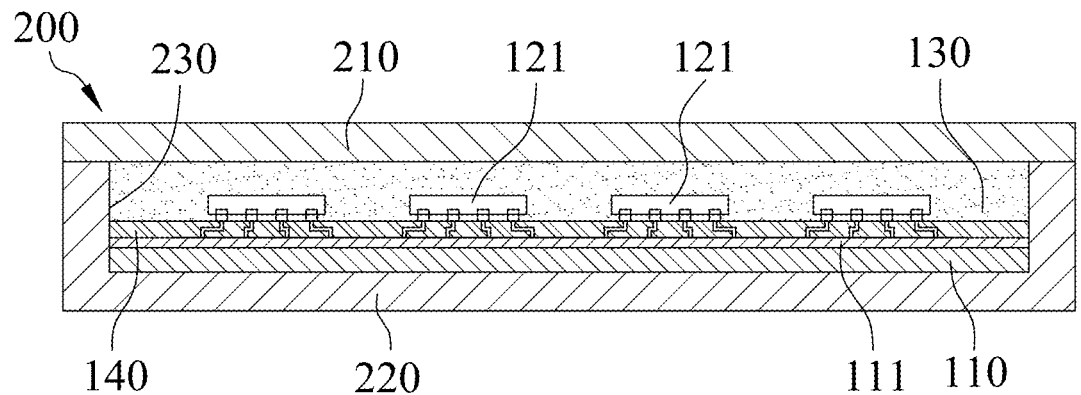
Figure 5D:
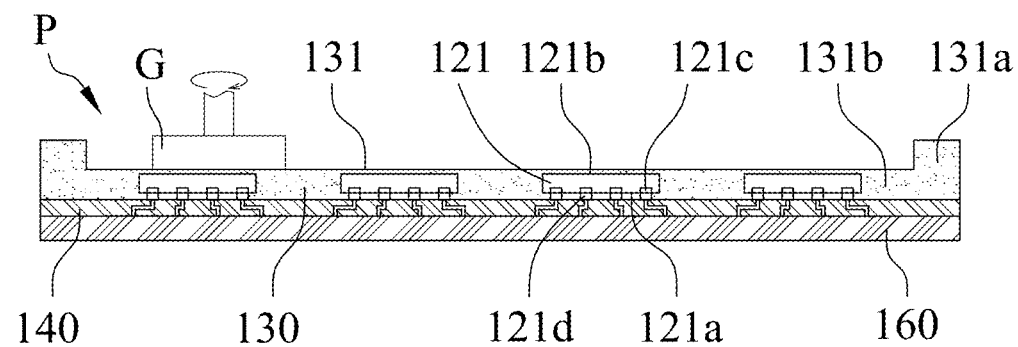

Different to the fourth embodiment, the recession 131 of the encapsulation 130 is formed by grinding in a fifth embodiment of the present invention presented in FIGS. 5A to 5D. The RDL 140 shown in FIG. 5A is also formed on the carrier 110 by metal plating using patterned photoresist mask. With reference to FIG. 5B, the chips 121 are mounted on the second surface 142 of the RDL 140, the bumps 121d of the chips 121 are electrically connected to the pads 121c and the RDL 140, thus the pads 121c are electrically connected to the RDL 140 via the bumps 121d. Next, with reference to FIG. 5C, the carrier 110 is placed in the mold cavity 230 of the mold 200, and the encapsulation 130 is formed on the carrier 110 to cover the semiconductor devices 120. With reference to FIG. 5D, the encapsulation 130 is taken out to be grinded by the grinder G, but the rim is not grinded. As a result, the recession 131 having the strengthening portion 131a and the recessed portion 131b is formed on the encapsulation 130. The strengthening portion 131a surrounding the recessed portion 131b can support the recessed portion 131b to reduce the risk of warpage and improve the strength and flatness of the recessed portion 131b. The subsequent processes are identical to the fourth embodiment and not mentioned again here.

Because of the recession 131 on the encapsulation 130, the strengthening portion 131a of the recession 131 is formed to protect the encapsulation 130 from warpage caused by insufficient strength and flatness and support the recessed portion 131b. Consequently, the recessed portion 131b of the encapsulation 130 can be thinned more and not require additional wafer support system. The present invention enables a significant simplification of semiconductor package fabrication.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A method of fabricating semiconductor package comprising steps of:
   disposing a plurality of semiconductor devices on a carrier;
   forming an encapsulation on the carrier, the encapsulation is configured to cover the plurality of semiconductor devices and includes a recession, wherein the recession includes a strengthening portion and a recessed portion, the strengthening portion protrudes from the recessed portion and surrounds the recessed portion; and
   removing the strengthening portion of the recession of the encapsulation,
   wherein each of the plurality of semiconductor devices includes a chip having an active surface and a back surface, the back surface is configured to contact with the carrier, there are a plurality of pads and a plurality of bumps on the active surface, each of the plurality of bumps is electrically connected to each of the plurality of pads, wherein a bottom surface of the encapsulation is configured to be ground to expose the plurality of bumps on the bottom surface after forming the encapsulation on the carrier, a redistribution layer is disposed on the bottom surface and electrically connected to the plurality of bumps, a plurality of connectors are disposed on the redistribution layer, and each of the plurality of connectors is electrically connected to each of the plurality of bumps via the redistribution layer.

2. The method in accordance with claim 1, wherein the plurality of semiconductor devices are embedded in the recessed portion of the recession.

3. The method in accordance with claim 2, wherein the plurality of the semiconductor devices are not embedded in the strengthening portion.

4. The method in accordance with claim 1, wherein a first distance exists between a recession bottom of the recessed portion and a bottom surface of the encapsulation and is less than or equal to 500 μm, and a second distance exists between a top surface of the strengthening portion and the bottom surface of the encapsulation and is more than or equal to 600 μm.

5. The method in accordance with claim 1, wherein a plurality of stiffening ribs are disposed on a recession bottom of the recession.

6. The method in accordance with claim 1 further comprising steps of:
   removing the carrier;
   adhering the encapsulation to a dicing tape; and
   dicing the encapsulation into a plurality of semiconductor package elements.

7. A method of fabricating semiconductor package comprising steps of:
   disposing a plurality of semiconductor devices on a carrier;
   forming an encapsulation on the carrier, the encapsulation is configured to cover the plurality of semiconductor devices and includes a recession, wherein the recession includes a strengthening portion and a recessed portion, the strengthening portion protrudes from the recessed portion and surrounds the recessed portion; and
   removing the strengthening portion of the recession of the encapsulation, wherein each of the plurality of semiconductor devices includes a chip and a redistribution layer, a first surface of the redistribution layer is configured to contact with the carrier, the chip having an active surface and a back surface is mounted on a second surface of the redistribution layer, there are a plurality of pads and a plurality of bumps on the active surface, the plurality of bumps are electrically connected to the plurality of pads and the redistribution layer, each of the plurality of pads is electrically connected to the redistribution layer via each of the plurality of bumps, wherein the carrier is configured to be removed and a plurality of connectors are disposed on the first surface of the redistribution layer after forming the encapsulation on the carrier, and each of the plurality of connectors is electrically connected to each of the plurality of bumps via the redistribution layer.

* * * * *